United States Patent
Ferrer Medina et al.

(10) Patent No.: US 10,813,249 B1
(45) Date of Patent: Oct. 20, 2020

(54) TUNABLE COLD PLATES

(71) Applicant: HEWLETT PACKARD ENTERPRISE DEVELOPMENT LP, Houston, TX (US)

(72) Inventors: Ernesto Ferrer Medina, Aguadilla, PR (US); Harvey Lunsman, Chippewa Falls, WI (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/526,960

(22) Filed: Jul. 30, 2019

(51) Int. Cl.
*H05K 7/20* (2006.01)
*G06F 1/20* (2006.01)

(52) U.S. Cl.
CPC .......... *H05K 7/20254* (2013.01); *G06F 1/20* (2013.01)

(58) Field of Classification Search
CPC .......... H05K 7/20218; H05K 7/20254; H05K 7/20509; H05K 7/20627; H05K 7/20772; H05K 7/20872; H05K 7/20927; H05K 7/20981; G06F 1/20
See application file for complete search history.

(56) References Cited

U.S. PATENT DOCUMENTS

| | | | |
|---|---|---|---|
| 7,151,668 B1* | 12/2006 | Stathakis | H01L 23/427 361/700 |
| 7,509,995 B2 | 3/2009 | Bhatti et al. | |
| 7,751,918 B2 | 7/2010 | Campbell et al. | |
| 9,307,674 B2 | 4/2016 | Chainer et al. | |
| 10,231,356 B2 | 3/2019 | Marroquin et al. | |
| 2001/0000880 A1* | 5/2001 | Chu | H01L 23/345 165/263 |
| 2005/0211418 A1* | 9/2005 | Kenny | F28D 15/00 165/80.4 |
| 2009/0277616 A1* | 11/2009 | Cipolla | H01L 23/473 165/104.33 |

(Continued)

FOREIGN PATENT DOCUMENTS

WO   WO-2011053310 A1   5/2011

OTHER PUBLICATIONS

Lytron, "Cold Plate Custom Design & Manufacturing," 2019, pp. 1-3 (online), Retrieved from the Internet on Jun. 25, 2019 at URL: <lytron.com/Cold-Plates/Custom/Cold-Plates-Assemblies>.

(Continued)

*Primary Examiner* — Adrian S Wilson
(74) *Attorney, Agent, or Firm* — Hewlett Packard Enterprise Patent Department

(57) ABSTRACT

An example tunable cold plate includes a body that is formed from a thermally conductive material and that includes a thermal interface surface to receive by conduction heat generated by a component of a computing device, such as a memory module. The cold plate includes a liquid coolant channel extending through the body. The cold plate also includes multiple orifices in the thermal interface surface that fluidly connect into the liquid coolant channel. The cold plate may also include one or more inserts that can be inserted into some or all of the orifices. The thermal performance of the cold plate, or a subsection thereof, may be tuned by varying the number of inserts that are inserted into the orifices of the cold plate or of the subsection.

20 Claims, 9 Drawing Sheets

(56) References Cited

U.S. PATENT DOCUMENTS

| | | | |
|---|---|---|---|
| 2011/0100666 A1* | 5/2011 | Wu .................... | H05K 7/20872 |
| | | | 174/15.1 |
| 2013/0027884 A1* | 1/2013 | Campbell .......... | H05K 7/20309 |
| | | | 361/700 |
| 2013/0135812 A1* | 5/2013 | Barina ................ | H01L 23/473 |
| | | | 361/679.32 |
| 2013/0194745 A1* | 8/2013 | Meijer ................ | G06F 1/20 |
| | | | 361/679.47 |
| 2013/0342987 A1* | 12/2013 | Yang .................. | H01L 23/40 |
| | | | 361/679.32 |
| 2014/0355983 A1* | 12/2014 | Gusat ................. | H04B 10/25 |
| | | | 398/45 |
| 2015/0068722 A1* | 3/2015 | Ding .................. | H05K 7/20945 |
| | | | 165/268 |
| 2017/0042067 A1* | 2/2017 | Parizeau ............ | H05K 7/20745 |
| 2018/0066663 A1* | 3/2018 | Kulkarni ............ | H05K 7/20772 |

OTHER PUBLICATIONS

Wakefield-Vette, Inc., "Liquid Cold Plates," 2019, 1-page (online), Retrieved from the Internet on Jun. 25, 2019 at URL: <wakefield-vette.com/products/liquid-cooling/liquid-cold-plates.aspx>.

\* cited by examiner

TUNABLE COLD PLATES

BACKGROUND

Computers include various components, such as processors and memory modules, among others. When in use, the components may generate heat, which, if left unchecked, may adversely affect the performance and health of the components of the computer. Thus, computers often include cooling solutions to cool (i.e., remove heat from) computing components.

DETAILED DESCRIPTION

Figure 1:
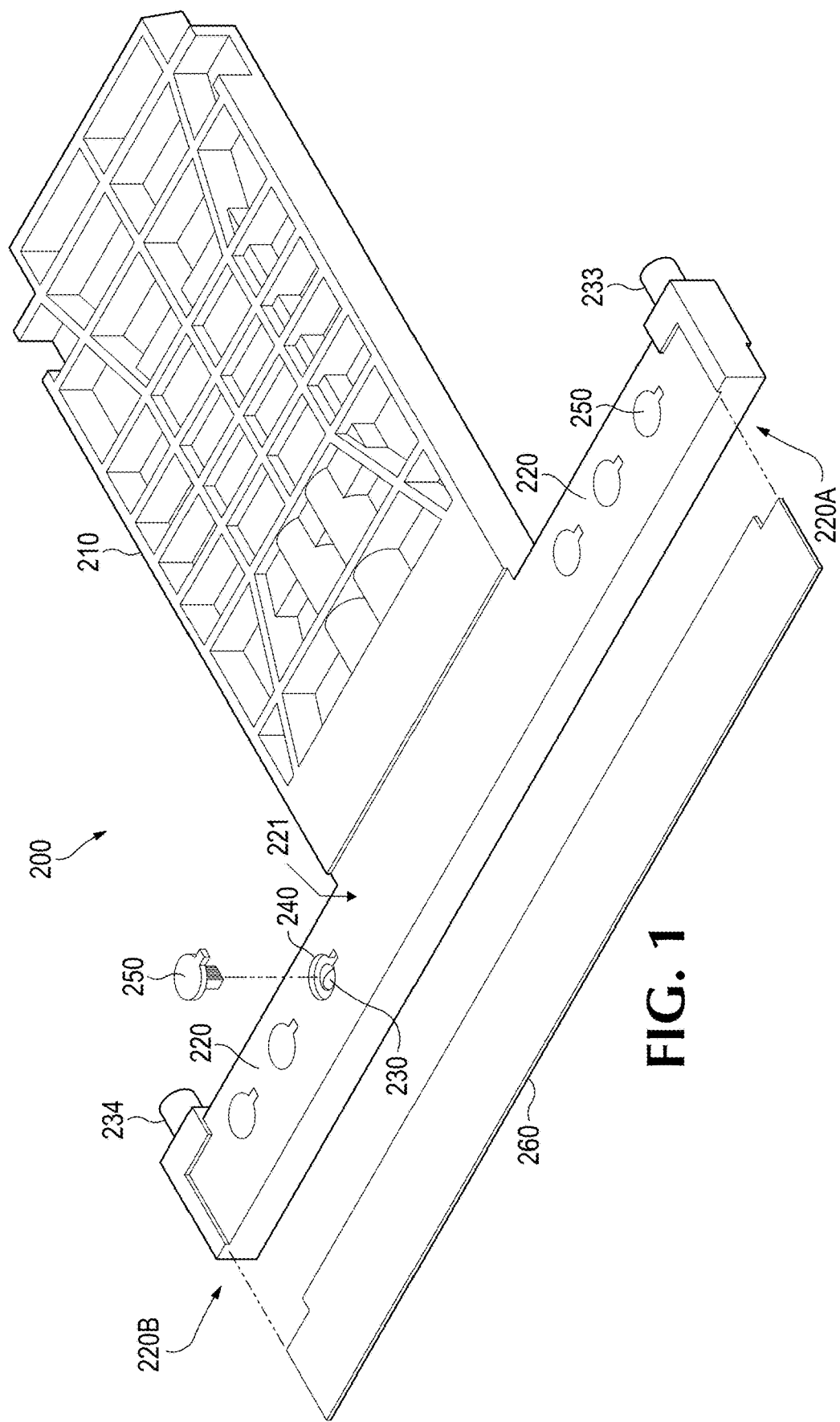
FIG. 1 illustrates a perspective view of an example tunable cold plate.

One approach to cooling computing components is to cause air to flow through the computing system. Heat from the components is dissipated into the air (in some cases, with the aid of a heat sink), and then as the air flows out of the system it carries the heat with it. However, in some circumstances, this air cooling approach may be suboptimal for some computing components, especially high power components such as processors and memory modules. For example, in modern high performance systems, each memory module may generate 12 W of heat or more, and each processor (CPU, SoC, etc.) may generate 250 W of heat or more. Thus, for example, a four-socket node board with eight memory modules per socket could generate 1,384 W or more just from the processors and memory modules. In order to sufficiently air cool these high power components, the system designer may have to make undesirable tradeoffs in other parameters, such as increasing the size of the computing device, increasing the power consumption (e.g., to power more or bigger fans, or to allow for higher fan speeds), increasing the noise generated by the system (due to more or bigger fans, or higher fan speeds), etc. In addition, air cooling of computing devices results in hot air being exhausted from the devices, the handling of which presents challenges for computing system and data center design. Thus, while air cooling may be a preferred cooling solution in many contexts, there are other contexts (particularly in high performance computing) in which air cooling might not be good enough.

Thus, for these and other reasons, liquid cooling is being pursued as an alternative approach to cooling computing components. Liquid cooling (sometimes called direct liquid cooling, or DLC) involves flowing liquid coolant (e.g., water) through a cooling loop in a computing system and thermally coupling the liquid coolant to the components that need to be cooled, so that heat generated by the components is transferred into the liquid coolant and carried out of the computing system.

The liquid coolant is usually thermally coupled to the components by a device called a cold plate. The cold plate is installed on the components, and the liquid coolant is caused to flow on or through the cold plate. The cold plate creates a thermally conductive (low resistance) path between the component and the liquid coolant, thus enabling heat to flow from the component into the liquid coolant. For example, a thermally conductive portion of the cold plate that is in contact with (or otherwise thermally coupled to) the liquid coolant may be interposed between the component and the liquid coolant, and the heat may pass from the component into the cold plate and then into the liquid coolant. In some examples, the liquid coolant flows through the cold plate via an interior channel that is integral to a main body of the cold plate, while in other examples the cold plate may include a pipe or tube that carries the liquid coolant through the cold plate, where the pipe or tube is a distinct part from the main body of the cold plate.

Although liquid cooling is a great cooling solution in certain contexts, there are some difficulties associated with it. In particular, as the liquid coolant passes through the system, its temperature increases with each component that it cools. However, the hotter the liquid coolant is, the less effective it is at cooling the components, all other things being equal (the rate of heat transfer decreases as the temperature of the liquid increases). Accordingly, any components that are downstream of other components in the cooling loop may receive relatively worse cooling performance than they otherwise would due to the coolant they receive being hotter. This can lead to imbalances in cooling amongst components. Such imbalances in cooling can be problematic in that they may lead to over-provisioning cooling resources for some components in order to ensure that the worst-off component is acceptably cooled. In addition, some components (such as memory) may suffer in performance or stability when operational parameters (e.g., temperature) are not uniform across the group of components, and therefore imbalances in the cooling performance of cold plates that are to cool such components may be detrimental.

One approach to mitigate such imbalances would be to provide the different components with different cold plates having thermal properties customized to their particular situation, to offset differences in the temperature of the coolant they receive. However, such an approach may be costly and increase manufacturing complexity, as many different custom cold plates would have to be designed for a range of different conditions and the number of stock-keeping-units (SKUs) needed for assembling the computing device would increase. In addition, such an approach would make post-manufacture changes to the system difficult, as new cold plates may need to be obtained if components of the system are upgraded or otherwise changed.

Another approach to mitigate such imbalances would be to try to arrange all of the components of the system in parallel in the liquid cooling loop such that they all receive the same temperature of liquid coolant. However, this approach leads to more complex liquid cooling loops, and is not always possible in some systems. Furthermore, although this approach may be able to balance the thermal performance between cold plates that are in parallel, it is unlikely to be able to balance the thermal performance between different subsections of the same cold plate.

Thus, to mitigate these and other problems, this disclosure describes example tunable cold plates for liquid cooling computer components, where the thermal performance of the cold plate (or subsections thereof) can be tuned so as to reduce or eliminate the imbalances in cooling performance between upstream and downstream components. In particular, the tunable cold plate includes a body that is to receive, by conduction, heat generated by components (e.g., memory modules), and a liquid coolant channel flowing through the body. Importantly, the tunable cold plate also includes multiple orifices (openings) in the body that fluidly connect the liquid coolant channel to the exterior environment around the body. These orifices are located under a heat transfer plate that thermally couples the body to the components. Inserts are also provided, which may be inserted into the orifices, and which include features (heat transfer surface extensions such as fins) that extend into the coolant channel to improve heat transfer from the heat transfer plate into the liquid coolant.

With each insert that is inserted into an orifice, the rate of heat transfer from the components into the liquid coolant increases by some amount. For example, at a given liquid temperature, the cold plate may have a rate of heat transfer of $R_0$ when no inserts are inserted, a rate of heat transfer of $R_0+\Delta R_1$ when one insert is included, a rate of heat transfer of $R_0+\Delta R_1+\Delta R_2$ when two inserts are included, and so on. Thus the thermal performance of the example cold plates may be tuned to different levels by changing how many inserts are inserted into the orifices.

This tuning may enable imbalances in thermal performance to be mitigated or even eliminated in some cases. For example, a cold plate used to cool a device that is upstream in the liquid coolant flow may be provided with fewer inserts, while a cold plate used to cool a device that is downstream in the liquid coolant flow may be provided with more inserts. Having more inserts in the downstream cold plate improves the thermal performance of the downstream cold plate to the point that the rate of heat transfer of the downstream component is the same as (or closer to) that of the upstream component notwithstanding the fact that the liquid coolant is hotter at the downstream component. In other words, the positive effect on the heat transfer rate of having more inserts counteracts (ideally cancels out) the negative effect on heat transfer rate of having a higher liquid coolant temperature.

Not only can the orifices and inserts be used to tune the thermal performance of different cold plates relative to one another, they can also be used to tune the thermal performance of different portions of the same cold plate. That is, in a cold plate that includes multiple portions that interface with and cool multiple different computing components, the number of inserts that are included in the orifices of the different portions may be varied to tune the thermal performance of each portion. For example, an example tunable cold plate may include a first section to cool a first group of memory, and a second section to cool a second group of memory, and the section that is downstream may be provided with more inserts to ensure that they have similar heat transfer rates notwithstanding differences in liquid coolant temperature.

Additional advantageous features of the example tunable cold plates and computing systems that employ them will be described in greater detail below with reference to certain detailed implementation examples. It should be understood that the implementation examples described below are merely some examples of how the tunable cold plates and computing systems could be implemented, and that other examples of the tunable cold plates and computing systems could omit some of the features described below and/or could include additional features not described below. For example, the example cold plate described in greater detail below is for cooling a processor and memory modules, but it should be understood that the same principles are applicable to a cold plate for cooling other computing components. Moreover, it should be understood that features described in relation to one implementation example could be included in another implementation example even if not shown or described.

1. Example Tunable Cold Plate

An example tunable cold plate 200 will now be described with primary reference to FIGS. 1-5. In the description below, as features of the cold plate 200 are described, figures that are particularly relevant to the feature under discussion will be identified. Thus, the figures will not necessarily be described in strict numerical order. Some features may be visible in many of the figures, but in some cases only one or a few of the figures thought to be most useful to understanding that feature will pointed out.

Figure 4:
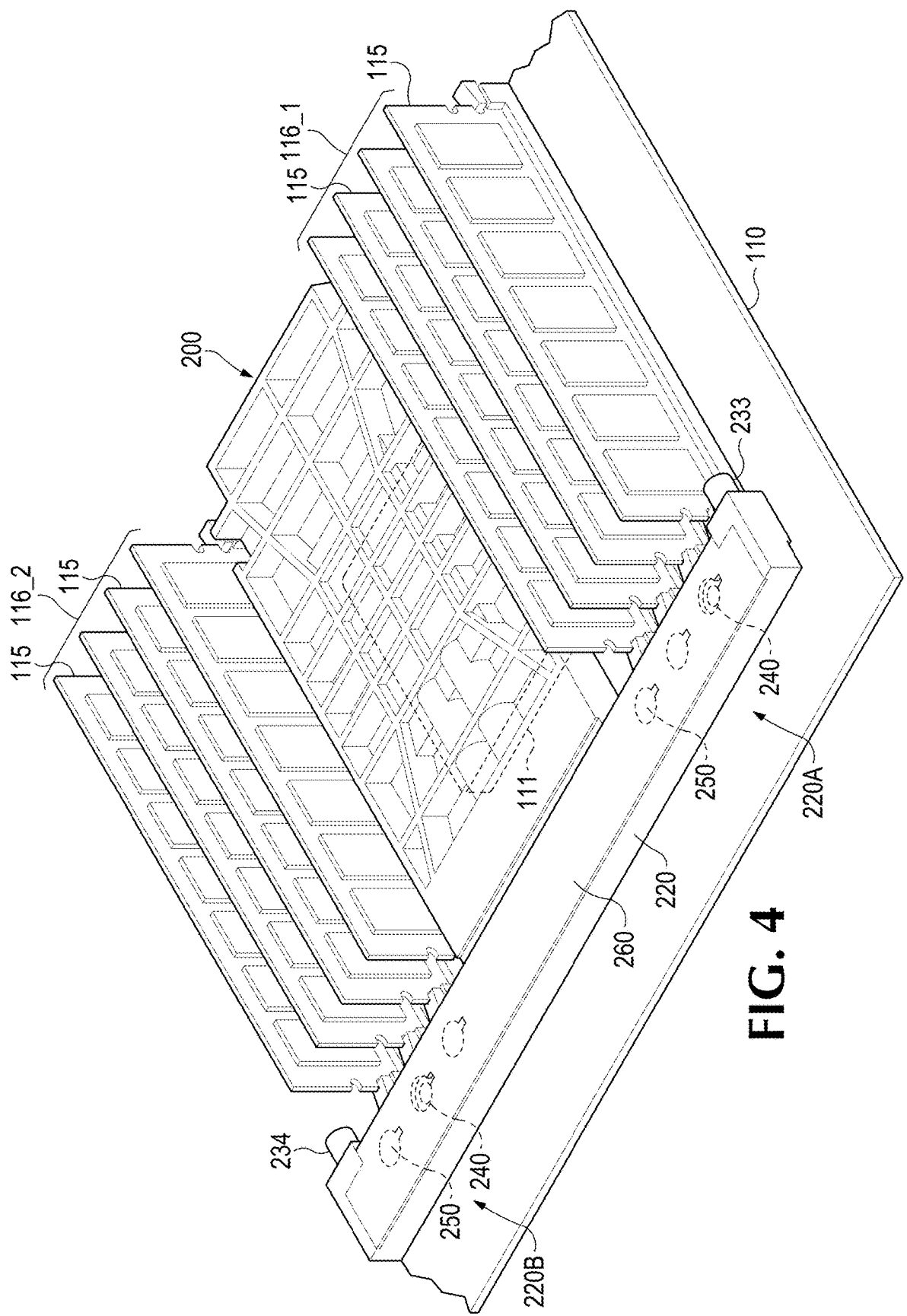
FIG. 4 illustrates a perspective view of a computing device with the example tunable cold plate of FIG. 1 installed therein.

The example cold plate 200 is designed to cool both a processor 111 and two groups 116 of memory modules 115 that are arranged on either side of the processor 111, among other components. Thus, as shown in FIGS. 1 and 4, the example cold plate 200 has a main body that includes a processor cooling section 210 to cool the processor 111 and a memory cooling section 220 to cool the memory modules 115.

Note that the cold plate 200 may also cool other components in the vicinity of the processor 111, such as voltage regulators. The cold plate 200 also may cool the board to which all the components are mounted. Thus, although the description herein will primarily focus on the processor 111 and the memory 114 as examples of components to be cooled, it should be understood that the same principles may apply to cooling other components.

More specifically, as shown in FIG. 1, in an example, the memory cooling section 220 is elongated and extends in a first direction, the processor cooling section 210 is connected to the memory cooling section 220 around a middle region thereof, and the processor cooling section 210 extends away from the memory cooling section 210 in a second direction perpendicular to the first direction. Thus, in this example, the cold plate 200 is roughly "T"-shaped. As shown in FIG. 4, when the cold plate 200 is installed in a computing system, the processor cooling section 210 is located on top of a processor 111 of the system, while a first side 220A of the memory cooling section 220 is located next to a first group 116_1 of memory modules 115 and a second side 220B of the memory cooling section 220 is located next to a second group 116_2 of memory modules 115. (Note that the two sides of the memory cooling section 220 that are located on either side of the processor memory section 210 may be referred to herein as a first side 220A or first memory subsection 220A and a second side 220B or second memory subsection 220B when it is desired to distinguish between them.)

In some examples, the main body of the cold plate 200, which includes the processor cooling section 210 and the memory cooling section 220, is formed as one continuous body, such as by injection molding, 3D-printing, or another monolithic manufacturing process.

In some examples, the main body of the cold plate 200 may be formed of a thermally conductive material. This may be advantageous in that it may improve the rate of heat transfer from the memory modules into the liquid coolant, and may also enable improved cooling of the board and other components that the cold plate comes into contact with. In some examples, the main body of the cold plate 200 is formed from a thermally conductive plastic, such as TECACOMP® TC compounds, CoolPoly® D-series Thermally Conductive Plastics, etc. The use of a thermally conductive plastic for the cold plate 200 is advantageous in that they are often lighter and cost less than similarly-shaped metal components, and they may be easier to form into the desired shape (e.g., using techniques such as injection molding).

In other examples, the main body of the cold plate 200 is formed from a material that would not be classified as thermally conductive according to the definition below, but which may nonetheless have sufficient thermally conductivity to provide satisfactory thermal performance. For example, plastics, which can have thermal conductivities as low as 0.1 $Wm^{-1}k^{-1}$, may be used to form the main body. In some examples, the inclusion of the orifices 240 and the inserts 250 may sufficiently increase the thermal performance enough to offset the lower thermal conductivity of such plastics (as compared to thermally conductive plastics or metals).

Figure 2:
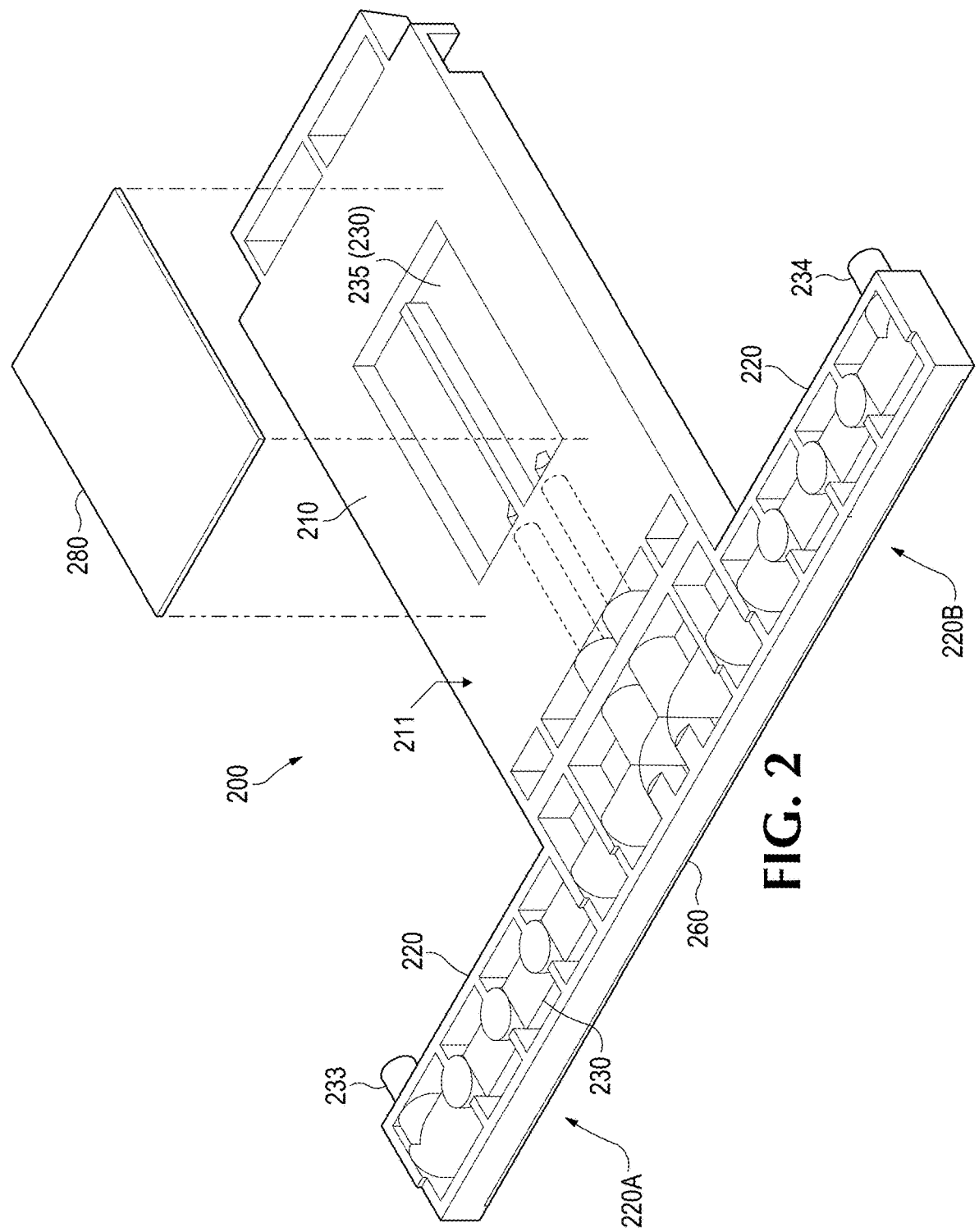
FIG. 2 illustrates another perspective view of the example tunable cold plate of FIG. 1.
Figure 5:
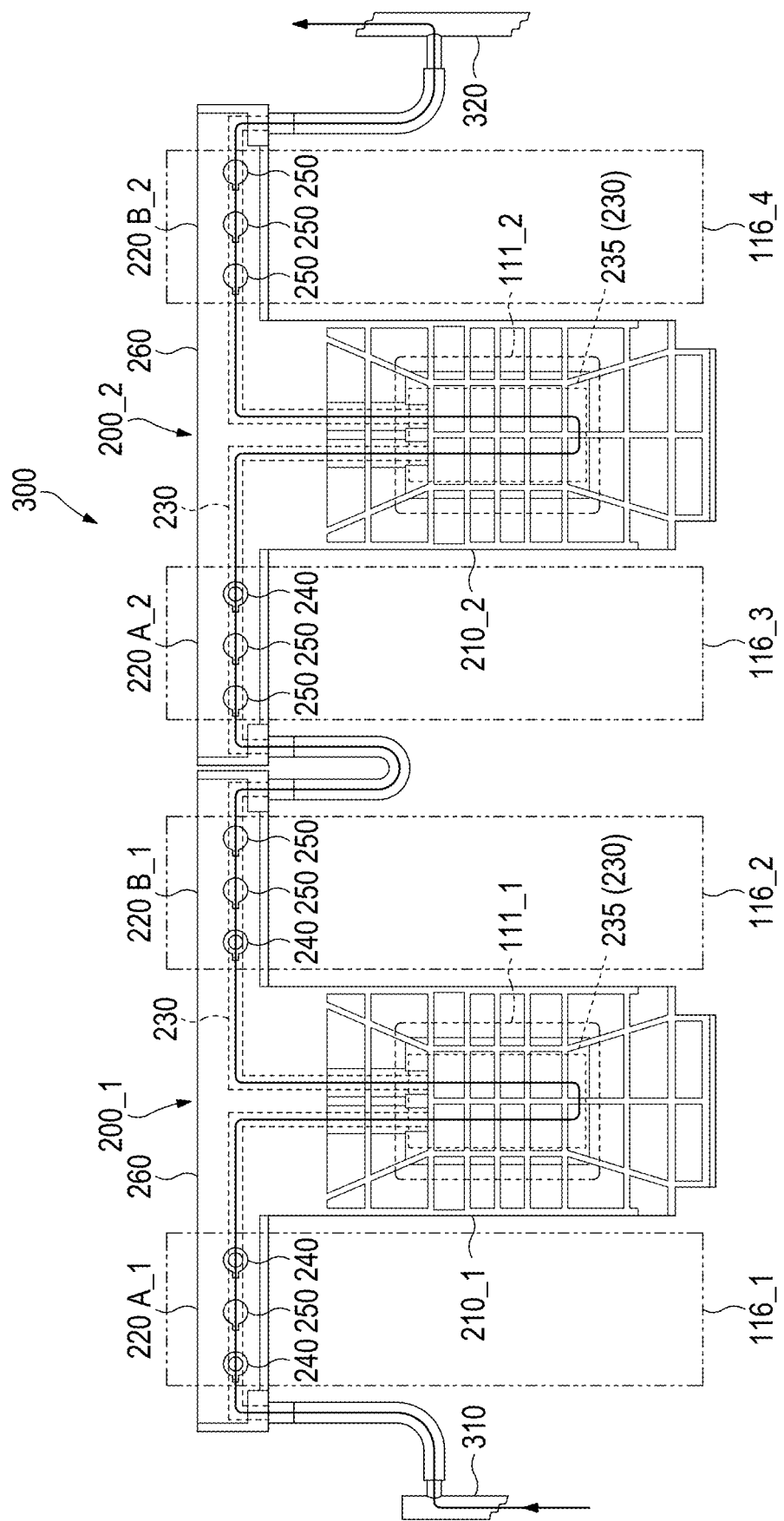
FIG. 5 illustrates a top plan view of a cooling loop including two of the example tunable cold plates of FIG. 1 fluidly connected in series.

As shown in FIG. 5 (see also FIGS. 1 and 2), the cold plate 200 includes a liquid coolant conduit 230 running through its main body and through which liquid coolant is to flow. Specifically, the conduit 230 extends from a first liquid connector 233 attached to the first memory subsection 220A to a second liquid connector 234 attached to the second memory subsection 220B, passing through the processor cooling section 210 along the way (FIGS. 2 and 5). Thus, if liquid coolant flows from the first connector 233 to the second connector 234, then the liquid would flow in the following manner: from the first connector 233 into the first side 220A, from the first side 220A into the processor cooling section 210, from the processor cooling section 210 to the second side 220B, and then out via second connector 234 (see FIGS. 2 and 5). For example, the thick solid line with arrows in FIG. 5 indicates a flow path of liquid coolant through the liquid conduits 230 of two cold plates 220 that are coupled in series between a supply line 310 and a return line 320. The liquid coolant conduit 230 may be integrally formed within the body of the cold plate 200. The figures illustrate the liquid coolant conduit 230 having the shape of a tube with a roughly circular cross-section, but this is merely one example, and the conduit 230 may have any desired shape.

As shown in FIG. 1, the first and second liquid connectors 233, 234 are located at terminal ends of the liquid conduit 230 and are to fluidly connect the conduit 230 into a liquid cooling loop of the computing system, as shown in FIGS. 5-9. When the cold plate 200 is connected into a liquid cooling loop, one of the connectors 223, 234 will serve as an inlet 231 for the conduit 230 and one will serve as an outlet 232 for the conduit 230 (see FIGS. 5-9). Generally, whichever one of the connectors 223, 234 is to receive an inflow of liquid coolant from an upstream section of the coolant loop (e.g., a coolant supply line) is the inlet 231, while whichever one of the connectors is to discharge the coolant into a downstream section of the coolant loop (e.g., a coolant return line) is the outlet 232. The coolant can flow through the cold plate 200 in either direction, depending on how the cold plate 200 is connected into the coolant loop, and thus either one of the connectors 223, 234 could be the inlet 231 or the outlet 232, and these roles are not intrinsically fixed outside of the specific context of a liquid cooling loop in which the cold plate 200 is installed. Thus, references herein to a cold plate as including an "inlet" and an "outlet" should be understood to mean that the cold plate includes two liquid connectors that are capable of serving as an inlet and an outlet when the cold plate is installed in a coolant loop, without necessarily implying that the cold plate is already so installed.

As shown in FIG. 2, the processor cooling section 210 may include, for example, a liquid coolant chamber 235. The liquid coolant chamber 235 may be a part or subsection of the conduit 230. Thus, liquid coolant passes through the liquid coolant chamber 235 as it flows through the liquid conduit 230 between the liquid connectors 233 and 234 (see FIG. 5). The liquid coolant chamber 235 is to enable the liquid coolant flowing through the conduit 230 to thermally couple with the processor 111. Thus, in some examples, the liquid coolant chamber 235 may include an opening that exposes the interior of the liquid coolant chamber 235 to an exterior environment around the processor cooling section 210 (FIG. 2). This opening may be located in a bottom side 211 of the processor cooling section 210, and may be covered/closed by a processor heat transfer plate 280 of the cold plate 200 that is connected to the bottom side 211 of the processor cooling section 210 when the cold plate 200 is installed on the processor 111 (FIG. 2). The processor heat transfer plate 280 is thermally conductive, and is thermally coupled to the processor 111 and in contact with the liquid coolant in the chamber 235, and thus the processor heat transfer plate 280 forms a low resistance heat flow path from the processor 111 to the liquid coolant in the chamber 235. In some examples, the processor heat transfer plate 280 is a highly thermally conductive material, such as copper, aluminum, etc. In some examples, the processor heat transfer plate 280 may include features (not shown) to increase the amount of its surface area that is exposed to the liquid coolant, such as fins, pin fin arrays, surface roughening, etc. The processor heat transfer plate 280 may be sealed liquid tight to the bottom side 211 via, for example, a gasket, an adhesive, an O-ring, etc.

As shown in FIG. 1, the memory cooling section 220 includes a thermal interface surface 221, which is to receive, by conduction, the heat generated by the memory modules 115. In the illustrated example, the thermal interface surface 221 is a flat upward facing surface of the memory cooling section 220 that extends across a majority of a top side of the memory cooling section 220 (FIG. 1). The cold plate 200 also includes a thermally conductive heat transfer plate 260 (see FIGS. 1 and 4), which is to be placed on top of and in contact with the thermal interface surface 221 when the cold plate 200 is installed, as shown in FIG. 4. The heat transfer plate 260 is also thermally coupled to the memory modules 115 when the cold plate 200 is installed (see FIGS. 4 and 6), as described in greater detail below.

Figure 6:
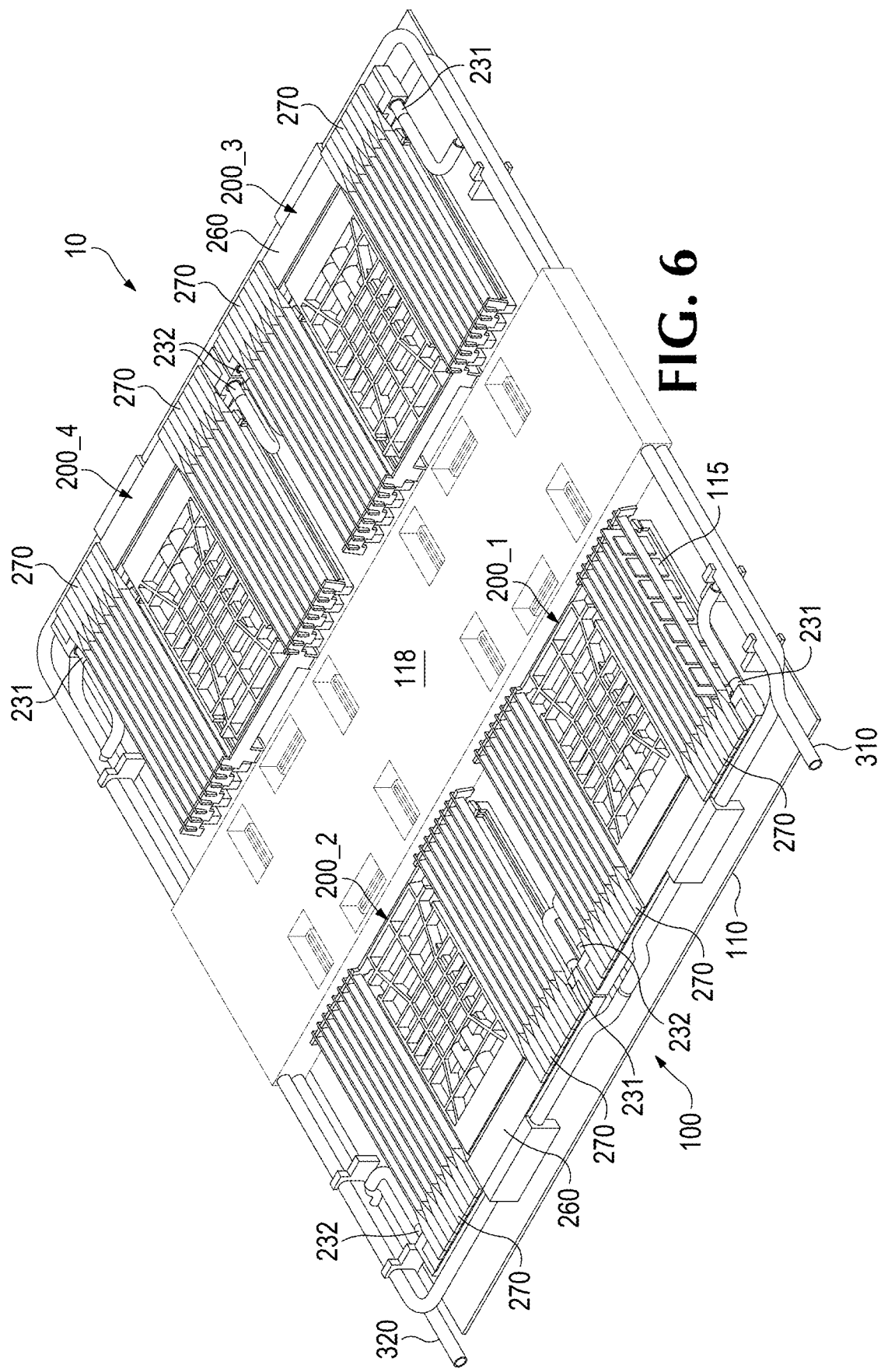
FIG. 6 illustrates a perspective view of a computing device with four of the example tunable cold plates of FIG. 1 installed therein, with the cold plates being fluidly connected in parallel in a cooling loop.
Figure 7:
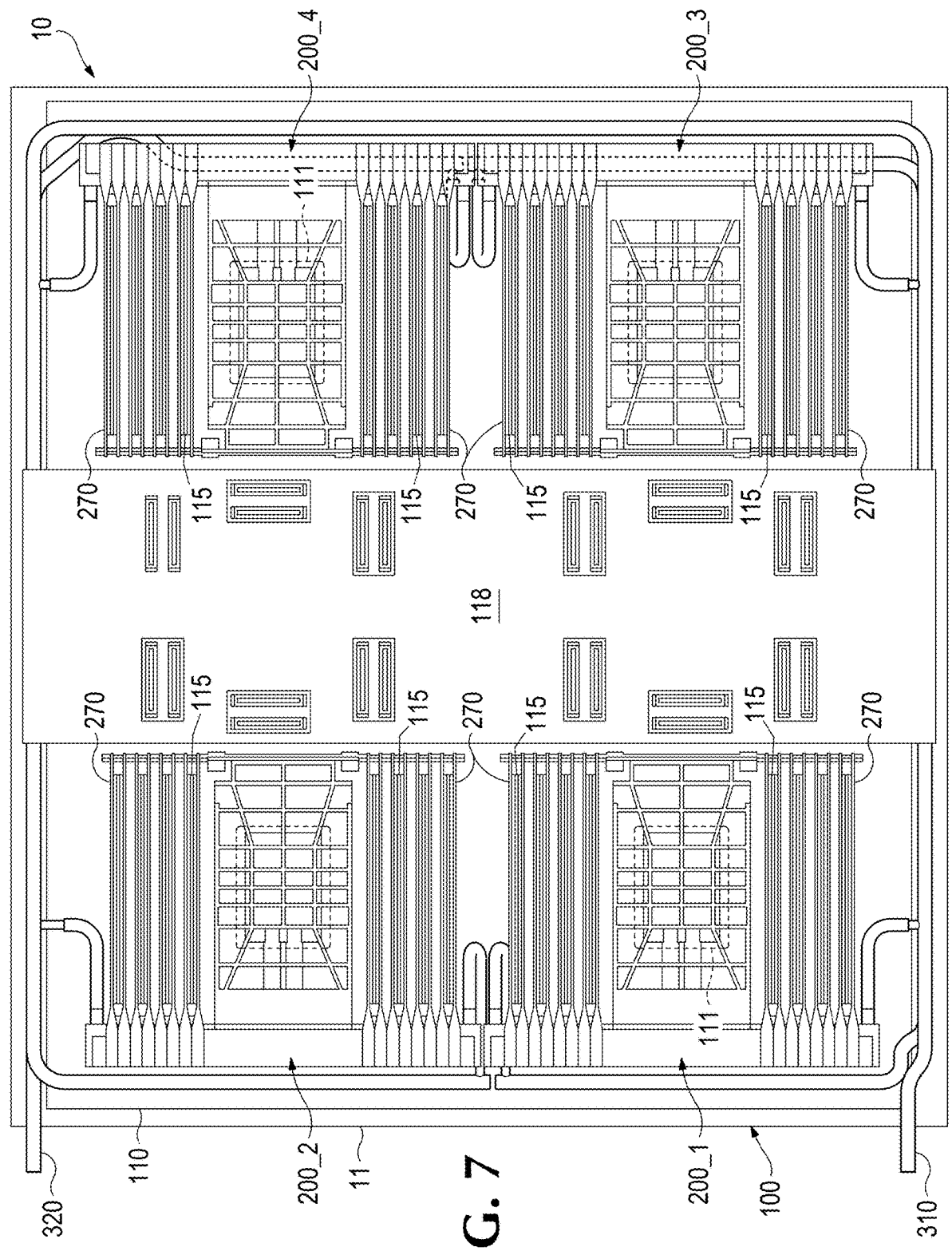
FIG. 7 illustrates a top plan view of the example computing device of FIG. 6.
Figure 8:
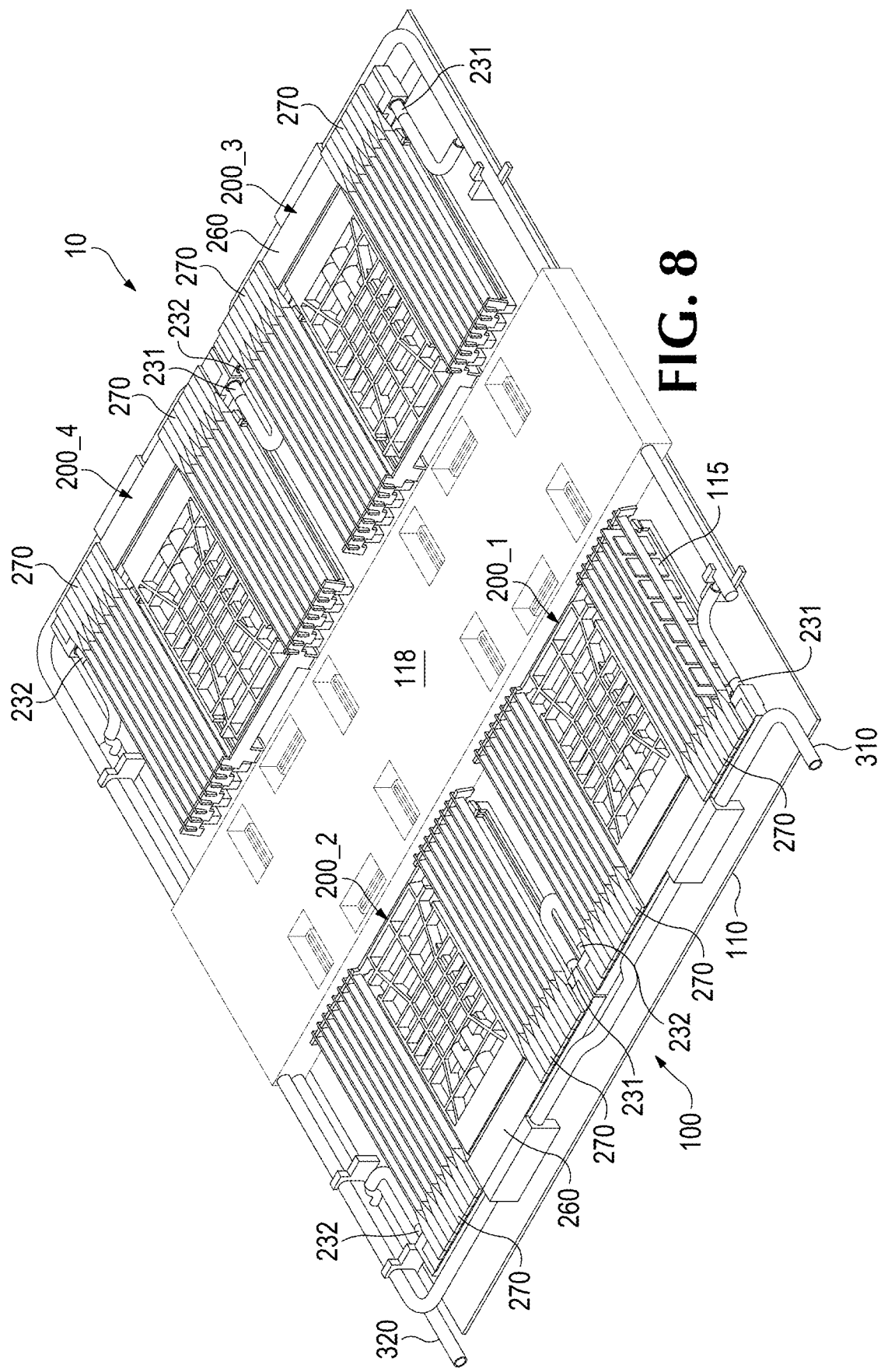
FIG. 8 illustrates a perspective view of a computing device with four of the example tunable cold plates of FIG. 1 installed therein, with the pairs of the cold plates being fluidly connected in series.

In particular, heat transfer devices 270 may be arranged alongside and between the memory modules 115, and may be thermally coupled to both the memory modules 115 and the heat transfer plate 260. FIG. 4 shows the location of the cold plate 200 relative to the memory modules 115 when installed, but omits the heat transfer devices 270 to avoid obscuring details. An example of how the heat transfer devices 270 can be arranged is shown in FIGS. 6-9. In particular, in this example, the ends of the heat transfer devices 270 may be affixed in contact with (e.g., welded, soldered, mechanically secured, etc.) a top surface of the heat transfer plate 260 (see FIGS. 6-9), and when installed the heat transfer devices 270 run in between and make contact with sides surfaces of memory modules 115 (see FIG. 6-9). Thus, heat may flow from the memory modules 115 into the heat transfer devices 270, from there into the heat transfer plate 260, from there into the thermal interface surface 221 and the inserts 250 (if any are installed), and from there into the liquid coolant flowing through the conduit 230. Note that, although only one memory module 115 is shown in FIGS. 6 and 8 to avoid obscuring other details, in practice there could be multiple memory modules 115 (see, for example, FIGS. 4, 7, and 9). In some examples, the heat transfer devices 270 may be heat pipes. In some examples, the heat transfer plate 260 may be a highly thermally conductive material, such as copper, aluminum, etc.

As shown in FIG. 1, the memory cooling section 220 of the cold plate 200 also includes multiple orifices 240, as well as one or more inserts 250 (see FIG. 3) which are to be inserted in the orifices 240 (see also FIGS. 4 and 5). These orifices 240 and inserts 250 may serve at least two purposes: first, they improve the rate at which the heat generated by the memory modules 115 is transferred into the liquid coolant flowing through the memory cooling section 220, and second they enable the tuning of the thermal performance of the subsections 220A and 200B and/or the cold plate 200 as a whole.

As shown in FIG. 1, the orifices 240 are openings or holes in the thermal interface surface 221 that fluidly connect into the liquid coolant conduit 230. In an example, a first subset of the orifices 240 may be included in the first subsection 220A of the memory cooling section 220, and a second subset of orifices 240 may be included in the second subsection 220B of the memory cooling section 220 (see FIG. 1). In some examples, the first and second subsets of orifices 240 each include multiple of the orifices 240 (see FIG. 1).

As shown in FIGS. 4 and 5, when the cold plate 200 is installed, some of the orifices 240 may be filled (plugged) with an insert 250, but some of the orifices 240 might be left unfilled (unplugged). This enables tuning of the thermal performance of the cold plate 200, as mentioned above and described in greater detail below. The orifices 240 and any inserts 250 inserted therein are ultimately covered by the heat transfer plate 260 when the cold plate 200 is installed (see FIG. 4).

When an orifice 240 is left unfilled, this enables the liquid coolant within the liquid coolant conduit 230 to come into direct contact with the heat transfer plate 240. This direct liquid-to-plate contact occurring in the orifice 240 improves the rate of heat transfer, as compared to the case in which the orifice 240 is not there at all (all other things being held equal). Thus, merely including the orifices 240 may be enough, in some circumstances, to improve the heat transfer rate of the memory cooling section 220. This may be beneficial in cases in which the memory cooling section 220 is not able to provide a desired rate of heat transfer absent the orifices 240.

In addition, when an orifice 240 is filled with one of the inserts 250, the heat transfer rate is improved even more as compared to having just the orifice 240 alone (all other variables being held equal). The inserts 250 increase the heat transfer rate because they are thermally conductive and include surface extensions 254, which are features that increase an amount of surface area that is exposed to the liquid coolant when the insert 250 is inserted into an orifice 240 (see FIGS. 3A and 3B). For example, the surface extensions 254 may be fins (shown in FIG. 3), pin fin arrays, surface roughening, etc. The more inserts 250 that are included in a cold plate 200 or subsection thereof, the greater the increase in the heat transfer rate of that cold plate 200 or subsection thereof. In other words, the heat transfer rate of a cold plate 200 or a subsection thereof scales with the number of inserts 250 that are inserted into the orifices 240 of that cold plate 200 or subsection thereof.

In addition to being able to improve the thermal performance of the cold plates 200, the orifices 240 and inserts 250 can also be used to tune the thermal properties of the cold plate 200, as mentioned above. Specifically, the cold plate 200 (or a subsection thereof) may be tuned (approximately) to have a desired thermal transfer rate by varying the number of inserts 250 that are inserted into the orifices 240. This tuning may be used, for example, to balance the thermal performance of various cold plates 200, or subsections thereof.

Generally, balancing the thermal performance of cold plates 200 (or subsections thereof) is achieved by providing those cold plates 200 (or subsections thereof) that receive relatively warmer liquid coolant with more inserts 250 than those cold plates 200 (or subsections thereof) that receive relatively cooler liquid coolant. In particular, according to some examples disclosed herein, if a cold plate 200 is downstream of another cold plate 200 in a cooling loop, then the downstream cold plate 200 should preferably have more inserts 250 than the upstream cold plate 200. For example, in FIG. 5 the upstream cold plate 200_1 has three inserts 250 inserted into its orifices 240 while the downstream cold plate 200_2 has five inserts 250 inserted into its orifices 240.

Not only may cold plates 200 be tuned relative to one another, but also individual portions or sections of a cold plate 200 may be tuned relative to the other sections of the same cold plate 200 or relative to other cold plates 200. In particular, even within the same cold plate 200, the two different memory subsections 220A and 220B may receive noticeably different temperatures of liquid coolant, due to the significant amounts of heat generated by the processor 111 located between the two memory subsections. Thus, in order to offset this temperature difference and balance the thermal performance of the two memory subsections 220A and 220B, different numbers of inserts 250 may be included in the respective orifices 240 of the two memory subsections 220A and 220B. Furthermore, individual subsections 220A or 220B of one cold plate 200 may be tuned relative to subsections 220A or 220B of other cold plates 200 in the same manner.

Thus, according to some examples disclosed herein, if a subsection 220A or 200B of a memory cooling section 220 of a cold plate 200 is downstream of a processor cooling section 210 (whether of the same cold plate 200 or a different cold plate), then the downstream subsection 220A or 220B should preferably have more inserts 250 than a subsection 220B or 220A that is upstream of the same processor cooling section 210. For example, in FIG. 5 the first side 220A_1 is upstream of the first processor 111_1 and is provided with just one insert 250, the second side 220B_1 and the first side 220A_2 are downstream of the first processor 111_1 and thus they each have two inserts 250, and the second side 220B_2 is downstream of both the first and second processors 111_1 and 111_2 and thus has all three orifices 240 filled with inserts 250.

These approaches tend to balance the heat transfer rates between the two cold plates 200 because the additional inserts 250 in the downstream cold plate 200 (of section thereof) offset the higher coolant temperature that the downstream cold plate 200 (or section thereof) receives. Of course, perfect balance between the heat transfer rates is not necessarily possible, but neither is it needed. When it is said that the tuning of the cold plates tends to balance the heat transfer rates, this should be understood to mean that the tuning improves the balance (e.g., decreases the standard deviation or mean absolute deviation) amongst the rates in question, not necessarily that it results in perfectly equal heat transfer rates.

Importantly, the tunable cold plates 200 not only allow for the thermal performance of the cold plates 200 (or subsections thereof) to be tuned, they do so without requiring multiple custom cold plates to be designed for the system. Instead, the same cold plate design may be used, for example, for all of the processors 111 and memory modules 115 in the system, and the cold plates may be tuned as needed for their particular situation. This reduces the number of SKUs that need to be kept, and decreases costs.

Furthermore, the tunable cold plates 200 make changing the system post-manufacture much easier than it would be as compared to a situation in which custom cold plates are used for each component. For example, if a component (e.g., memory module) is upgraded to a newer and hotter running model that requires better thermal performance of its cold plate, then in examples disclosed herein that use the tunable cold plate 200 it may be possible to keep the original cold plate 200 (rather than having to obtain a new custom cold plate) and simply re-tune the cold plate 200 to bring its thermal performance up to the needed level by inserting additional inserts 250 therein.

In addition, the inserts 250 may also be used to tune flow rates and pressure drops in sections of the liquid cooling loop 300. For example, the more inserts 250 that are inserted into a cold plate 300, the greater the resistance to flow through the cold plate 200 will be, which affects both the pressure and flow rate. In addition, certain inserts 250 may have different effects on flow rate, depending on their shape, size, and configuration, and thus tuning of the flow rate may depend not only on the number of inserts 250 that are used, but also on the type.

The specific number of inserts 250 that should be used in any given circumstance to achieve a particular thermal performance or flow rate or to balance cold plates 200 or section thereof will depend on the details of that particular circumstance, as well as the desired results to be obtained. In particular, the actual amount by which the heat transfer rate of a given section will increase as a result of inserting a particular insert 250 into an orifice 240 depends on many variables, such as the amount of surface area of the insert 250 that is exposed to the coolant (which depends on the geometry of the surface extensions 254), the material of the inserts 250, the temperature of the liquid coolant, the temperature of the heat transfer plate 260, the size of the orifices 240, etc. If such factors are known, then the number of inserts 250 that should be inserted may be determined by, for example, computer modeling using commercially available thermal modeling programs. Alternatively, the number of inserts 250 that should be used to achieve a particular desired result in a particular circumstance may be determined by empirical testing, for example, by varying the numbers of inserts 250, observing the thermal performance of the system, and identifying which number of inserts yields a preferred outcome.

Naturally, the ability to tune the heat flow rates of the cold plates 200 (or sections thereof) is not limitless. In particular, there can only be a finite number of orifices 240 and inserts 250 in any given cold plate 200, and this constrains the maximum amount of improvement obtainable by adding orifices 240 and inserts 250. Furthermore, the set of possible heat transfer rates obtainable by varying the number of inserts 250 is discreet and finite. In other words, the heat transfer rates step up in discontinuous jumps with each insert 250 that is added, and therefore the performance cannot necessarily be arbitrarily tuned to any desired heat transfer rates. Thus, when it is said herein that the performance of the cold plates 200 can be tuned, this should not be misunderstood as meaning that the performance can be arbitrarily tuned to any desired value—rather, it means that the performance may be tuned to one of a discrete set of possible values. The breadth of the range of possible heat transfer rates for the cold plate 200 or a subsection thereof may be increased by including more orifices 240 and/or increasing the individual heat transfer rate of each insert 250 (e.g., increasing the surface area of the extensions 254). The number of discrete adjustment levels that are possible can be increased by increasing the number of orifices 240. The granularity of the steps between the possible heat transfer rates of the cold plate or subsection can be increased (i.e., the distance between steps is decreased) by decreasing the individual heat transfer rate of each insert 250 (e.g., decreasing the surface area of the extensions 254).

Figure 3A:
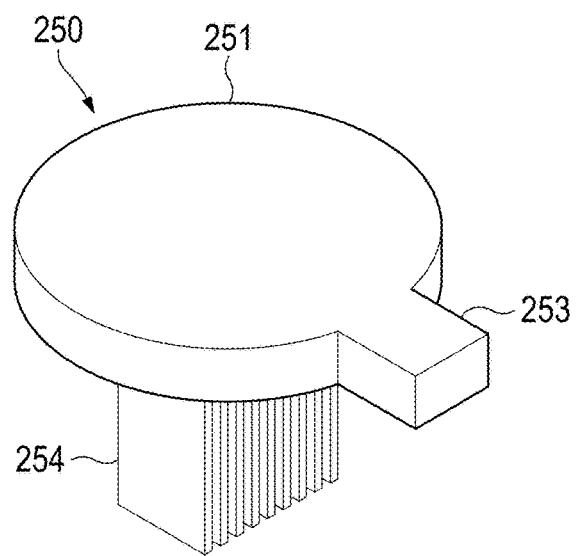
FIG. 3A illustrates a perspective view of an insert.
Figure 3B:
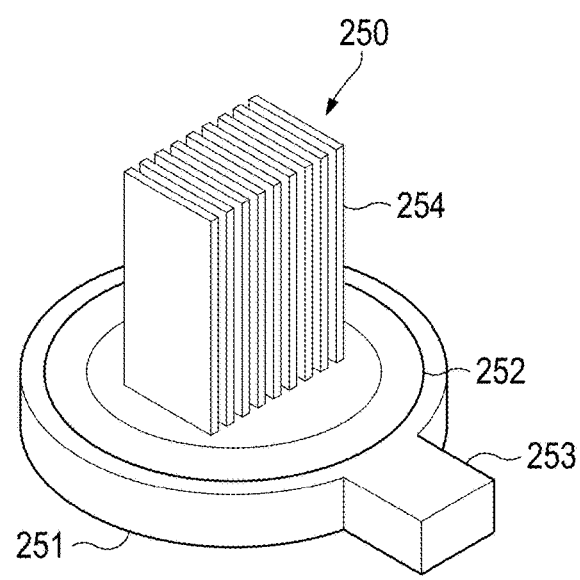
FIG. 3B illustrates another perspective view of the insert.

The inserts 250 will now be described in greater detail, with primary reference to FIGS. 3A and 3B. The inserts 250 include a base 251 and the aforementioned surface extensions 254 extending from the base 251 (FIGS. 3A and 3B). The base 251 and extensions 254 may be formed from a thermally conductive material. In some examples, the material may preferably be highly thermally conductive, such as copper, aluminum, etc.

In some examples, different inserts 250 having different surface extensions 254 may be used to even further fine tune the thermal or flow rate properties of the system. For example, some inserts 250 may have more surface extensions 254 (e.g., fins) and/or surface extensions 254 with more surface area than in other inserts 250, thus allowing different inserts 250 to provide different effects on thermal performance. As another example, some inserts 250 may have surface extensions 254 that impede the flow of liquid more than in other inserts 250, thus allowing different inserts 250 to provide different effects on flow rate and pressure. Thus, in some examples, not only may tuning be done by varying the number of inserts 250 that are used, tuning may also be done by varying the types of inserts 250 that are used.

The inserts 250 may also include a sealing mechanism, such as the O-ring 252, a gasket, or the like (FIG. 3B). The sealing mechanism seals the orifice 240 closed liquid tight when the insert 250 is inserted into the orifice 240. The inserts 250 may also include a keying feature 253, which is to mate with a complementary keying feature of an orifice 240 when the insert 250 is installed. The keying feature 253 may ensure that the insert 250 is installed in the preferred orientation (if there is a preferred orientation). For example, if the surface extensions 254 are fins, then it may be preferred for the fins to be parallel to a flow direction of the liquid coolant in the conduit 230 so as to minimize impedance of the flow.

The inserts 250 may be secured in place when inserted in an orifice 240 by any convenient means. For example, the inserts 250 may be secured in place by the presence of the heat transfer plate 260. The heat transfer plate 260, when installed, is fixed in place relative to the cold plate 200, and thus can prevent the inserts 250 from disengaging from the orifices. As another example, the inserts 250 may include mechanical fastening features (not illustrated) to affix them in an orifice 240, such as threading on an exterior circumference of the base 251 that engages with complementary threading on an interior of a rim of the orifice 240. As another example, mechanical fasteners (such as screws) or adhesives may be used to secure the inserts 250 in place.

When no insert 250 is installed in an orifice 240, in some examples a gasket or o-ring may be included in or around the orifice 240 to seal the orifice 240 liquid tight. For example, the orifice 240 may include a ledge around an opening thereof upon which the base 251 of an insert 250 may rest when the insert 250 is installed, and an o-ring may be placed on this ledge to seal the orifice 240 liquid tight when no insert 250 is going to be inserted in the orifice 240. In other examples, no gasket or o-ring is provided, and the unplugged orifices 240 may be sealed liquid tight simply by virtue of the heat transfer plate 260 being disposed on and covering the orifices 240.

2. Example Computing Systems

As noted above, the cold plate 200 is designed to be installed in a computing system to cool a processor 111 and memory modules 115 thereof. Various example computing systems 10 will now be described with primary reference to FIGS. 5-9.

An example computing system 10 may include one or more printed circuit assemblies (PCAs) 100 (FIGS. 6-9). Each PCA 100 comprises a printed circuit board (PCB) 110 to which computing components are attached (FIGS. 4 and 6-9). Such a PCA 100 may be referred to in the art as a system board, a motherboard, a node, a node board, a circuit board, or the like. The computing components attached to the PCB 110 may include, for example, one or more processors 111 and one or more memory modules 115 associated with the processor(s) 111 (FIGS. 4 and 6-9).

FIG. 4 illustrates an example system 10 that includes one processor 111 and two groups 116 of memory modules 115 arranged on either side of the processor 111. FIG. 5 illustrates an example in which the PCA 100 includes two processors 111, each with two associated groups 116 of memory modules 115. FIGS. 6-9 illustrate examples in which each PCA 100 includes four processors 111 (more specifically, four sockets, each of which may have multiple processor cores), each having two associated groups 116 of memory modules 115. These are merely examples, and in practice any number of processors 111 and memory modules 115 may be included on a PCA 100.

The processors 111 may include any processing resource or circuitry capable of executing machine readable instructions, including a central processing unit (CPU), a system-on-chip (SoC), a microprocessor, a microcontroller, and so on. The memory modules 115 may include any form factor of memory modules, such as a dual-in-line memory module (DIMM) form factor. The PCA 100 may include additional components, such as controllers, voltage regulators, communications interfaces, storage devices, and so on. Although the example cold plate 200 illustrated in the figures is intended to cool a processor 111 and memory 115, it should be understood that the same principles could be applied to a cold plate for cooling other components of the PCA 100.

Figure 9:
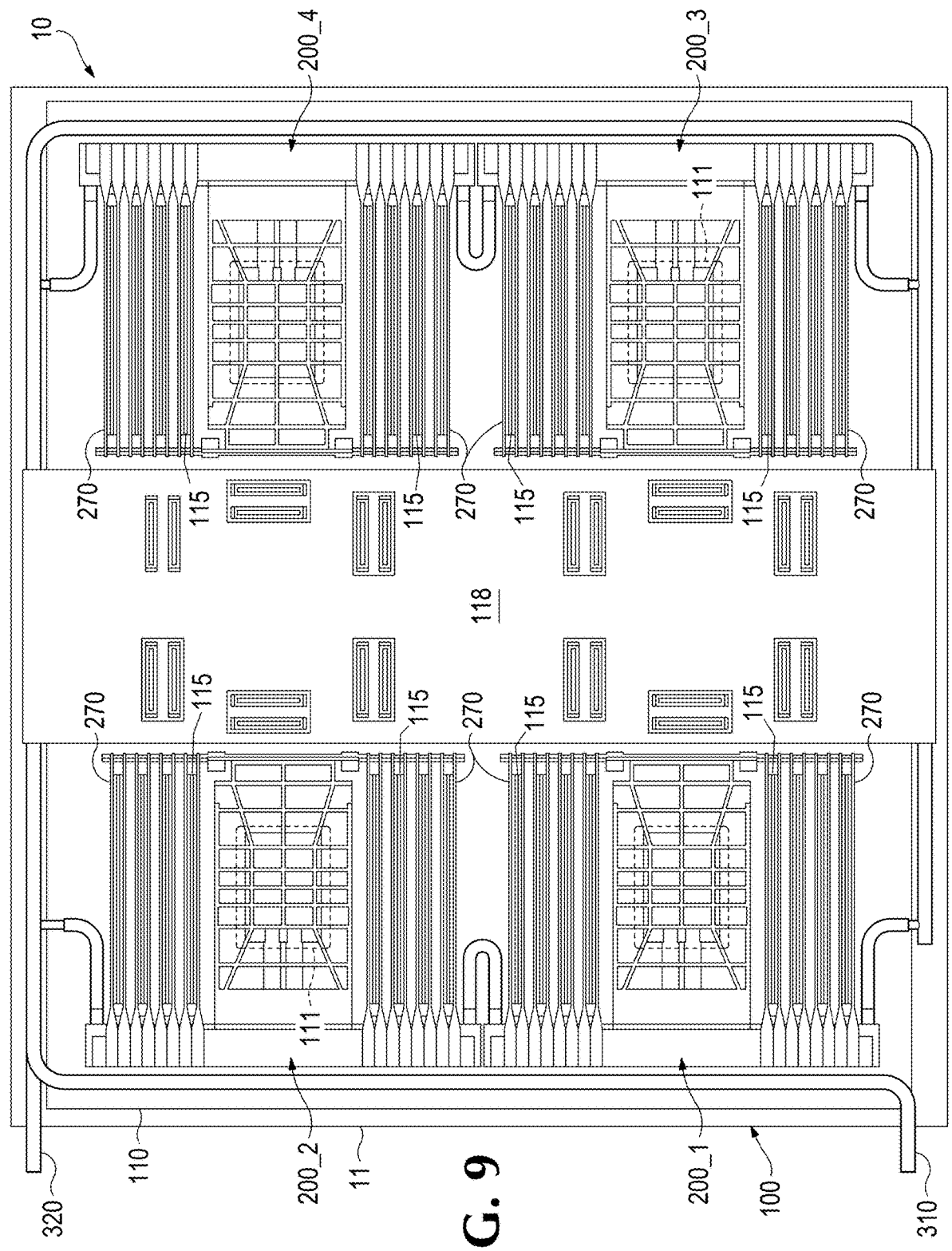
FIG. 9 illustrates a top plan view of the example computing device of FIG. 8.

In some examples, the PCA 100 is supported by and/or housed within a server chassis 11. FIGS. 7 and 9 show the server chassis 11 in the form of a tray upon which the PCA 100 rests, but in other examples the chassis 11 may entirely enclose the PCA 100. For example, the PCA 100 may form, or be part of, a rack server. In other examples, the server chassis 11 may be omitted.

In some examples, the system 10 may include a system chassis (not illustrated) that is to house multiple of the PCAs 100. For example, the PCAs 100 may be nodes of a high-performance computing system or blade servers of a blade system, and the system chassis may house multiple of such nodes or blades.

The computing system 10 may include a liquid cooling system that includes a liquid cooling loop 300 (FIGS. 5-9). The liquid cooling loop 300 includes at least one liquid coolant supply line 310 to receive liquid coolant from a coolant source and provide the liquid coolant to the cold plates 200 installed on the PCA 100. The liquid cooling loop 300 also includes at least one liquid coolant return line 320 that is to receive the liquid coolant from the cold plates 200 and return the liquid coolant back to the coolant source. The coolant source may include, for example, a coolant distribution unit, a chiller, a pump, and the like, which may be part of or separate from the computing system 10. The supply line 310 and the return line 320 may be connected to the coolant source via liquid connectors (not shown), such as dripless quick-disconnect liquid connectors.

In example computing systems 10, when multiple cold plates 200 are installed, the number of inserts 250 installed in each cold plate 200 may vary depending on a location and expected thermal needs of the cold plate 200. In particular, cold plates 200 that are expected to receive hotter liquid coolant are provided with more inserts 250 than cold plates 200 that are expected to receive cooler liquid coolant, as explained above.

In the example illustrate in FIGS. 6-7, the cold plates 200 are connected into the cooling loop 300 in parallel. That is, each of the cold plates 200 may have its inlet 231 connected to the supply line 310 to receive (approximately) the same temperature of liquid coolant. Thus, the cold plates 200 are natively thermally balanced relative to one another by virtue of their parallel connections, and therefore in this example each cold plates 200 may have the same number of insets 250. However, the parallel connection of the cold plates 200 does not natively balance the subsections of individual cold plates 200 relative to one another, and therefore in this example different subsections of each individual cold plate 200 may have different numbers of inserts 250. Note also, that the parallel connection of the cold plates 200 comes at the cost of a somewhat more complicated routing of the coolant loop 300, as will be more apparent after considering the alternative example of FIGS. 8-9.

In the example illustrate in FIGS. 8-9, the cold plates 200 are grouped into two pairs, and the cold plates 200 of a given pair are connected into the cooling loop 300 in series with each other (the pairs run in parallel). That is, a first cold plate 200_1 has its inlet 231 connected to the supply line 310, while the second cold plate 200_2 has its inlet 231 connected to the outlet 232 of the first cold plate 200_1. Similarly, the third cold plate 200_3 has its inlet 231 connected to the supply line 310, while the fourth cold plate 200_4 has its inlet 231 connected to the outlet 232 of the third cold plate 200_3. Thus, the first and second cold plates 200_1 and 200_2 are not natively thermally balanced relative to one another, and therefore in this example the second cold plate 200_2 may have more insets 250 than the first cold plate 200_1 in order to bring them into balance. The situation is the same with the third and fourth cold plates 200_3 and 200_4. In addition, as with the previous example, the subsections of individual cold plates 200 are not natively balanced relative to one another, and therefore different subsections of individual cold plates 200 may have different numbers of inserts 250. It can be seen that the routing of the cooling loop 300 is simpler in this example than in the previous example. This simplification in the routing of the cooling loop 300 is facilitated by the ability to tune the cold plates 200.

3. Example Methods

Example methods of installing and/or using example cold plates described herein (such as the cold plate 200) will now be described.

The methods may include providing a cold plate, such as the cold plate 200. Providing the cold plate may include manufacturing the cold plate, or purchasing or otherwise obtaining possession of an already manufactured cold plate. In some examples, manufacturing the cold plate may include forming the main body of the cold plate from a thermally conductive plastic by a monolithic manufacturing processes, such as injection molding, insert injection molding, 3D printing, etc.

The methods may also include installing the cold plate in a computing device, such as one of the PCAs 100 and/or one of the computing systems 10 described above. Installing the cold plate may include thermally coupling the cold plate to the component(s) it is intended to cool, securing the cold plate in this position, and fluidly coupling the cold plate into a liquid cooling loop of the computing device.

For example, if the cold plate 200 is used, then installing the cold plate 200 may include positioning the cold plate 200 such that the processor heat transfer plate 280 is thermally coupled to a processor 111 of a PCA 100 and also such that the processor heat transfer plate 280 is coupled to a bottom side 211 of the processor cooling section 210 and covering/closing the chamber 235, such as in FIG. 4. In some cases, the processor heat transfer plate 280 may be coupled to the processor 111 first, and then the processor cooling section 210 may be placed on top of the already-installed processor heat transfer plate 280. In other cases, the processor heat transfer plate 280 may be coupled to the processor cooling section 210 first, and then the resulting assembly may be installed together on the processor 111. The cold plate 200 may be secured to the PCA 100, for example by mechanical fasteners (e.g., screws, clamps, etc.). The cold plate 200 may be fluidly coupled into the cooling loop 300 by connecting one of its connectors 233, 234 to an upstream portion of the cooling loop 300, such as a liquid supply line 310 or the outlet 232 of another cold plate 200, and connecting the other one of the connectors 233, 234 to a downstream portion of the cooling loop 300, such as a liquid return line 320 or the inlet 231 of another cold plate 200.

In some examples, installing the cold plates 200 may also include coupling the heat transfer plate 260 to the thermal interface surface 221. In some examples, installing the cold plate 200 also may include coupling heat transfer devices 270 to the heat transfer plate 260 (before or after coupling the heat transfer plate 260 to the thermal interface surface 221), while in other examples the heat transfer devices 270 may already be coupled to the heat transfer plate 260 when the cold plate 200 is provided.

The methods may also include thermally coupling the cold plate to computing components. In some cases, one or more computing components may be thermally coupled to the cold plate as part of installing the cold plate. For example, when the cold plate 200 is used, the processor 111 is thermally coupled to the cold plate 200 as part of installing the cold plate 200. In some cases, one or more computing components may be thermally coupled to the cold plate after the cold plate has been installed. For example, when the cold plate 200 is used, it is possible for one or more memory devices 115 to be thermally coupled to the thermal interface surface 221 (via the heat transfer devices 270 and the heat transfer plate 260) after the cold plate 200 has been fully installed.

The methods may also include inserting a number of inserts comprising surface extensions into a number of the orifices of the cold plate. In an example, the number of inserts that are inserted may be selected based on the particular configuration of the cooling loop. For example, if the cold plate is downstream of another cold plate, then the cold plate may have more inserts inserted into its orifices than the upstream cold plate. In an example, the number of inserts that are inserted may be selected based on a desired thermal performance of the cold plate. In an example, the respective numbers of inserts that are inserted within orifices of different subsections of the cold plate may be selected based on a configuration of the cooling loop. For example, if a subsection of a cold plate is upstream of a heat source and another subsection (of that same cold plate or another cold plate) is downstream of the heat source, the number of inserts that are used in the downstream subsection may be more than the number of inserts that are used in the upstream subsection.

If the cold plate 200 is used, then the inserts 250 may be inserted into the orifices 240 at any convenient stage in the installation process in which the heat transfer plate 260 is not coupled to the thermal interface surface 221. After inserting the inserts 250, the heat transfer plate 260 may be coupled to the thermal interface surface 221 to secure the inserts 250 in place.

The methods may also include changing a number or distribution of inserts within a cold plate responsive to a planned (or actualized) change in the configuration of the cooling loop or in computing components of the computing device.

Heat Transfer Device: As used herein, "heat transfer device" refers to any device that is thermally conductive and that is configured to receive heat from one solid body via conduction (contact) and transfer the heat into a second solid body via conduction (contact). Examples include heat pipes, vapor chambers, heat spreaders, a solid bar or strip of metal, etc.

Heat pipe: As used herein, "heat pipe" refers to a specific type of thermal transfer device that includes a case (vessel) having walls that surround a sealed interior channel containing a working fluid and a wick such that the fluid transfers heat between different regions of the device by a cycle of vaporization and condensation.

Heat sink: As used herein, a "heat sink" is a device that receives heat from a solid body via conduction (contact) and dissipates that heat into air that flows around/through the heatsink. A heat sink is distinguished from other bodies that dissipate heat into air by the fact that the heat sink is specialized for this task, as evidenced by it including features, such as fins or pins, to increase the surface area of its portions that are in contact with the air to improve heat dissipation.

Liquid Cooled Cold Plate or Cold Plate: As used herein, "liquid cooled cold plate" and "cold plate" refer to a device that receives heat from a solid body via conduction (contact) and dissipates that heat into liquid coolant that flows on or through the cold plate. The liquid coolant is either (a) in direct contact with the cold plate (e.g., flowing through an interior chamber of the cold plate) or (b) flowing through a pipe/tube that is in contact with the cold plate.

Thermal Interface Material (TIM): As used herein, "thermal interface material" and "TIM" refer to relatively thin, thermally conductive, and compliant (easily deformable) material placed between two devices at their thermal interface to improve heat transfer rates by filling air gaps that would otherwise occur between the devices due to surface roughness and/or misalignment. Common examples include thermal gap pads, thermal grease, thermal paste.

Thermally couple: As used herein, to "thermally couple" two objects means to provide a thermally conductive pathway between the objects that allows heat to be conducted between the objects. Two objects or entities may be considered to be thermally coupled if any of the following are true: (1) the two objects are in contact with one another (either direct contact, or contact via a TIM), (2) the objects are both thermally coupled to the same thermal transfer device or to a chain of thermally coupled thermal transfer devices, or (3) a heat transfer coefficient between the two objects is 10 $W \cdot m^{-2} \cdot K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is a continuous piece of a material that has a thermal conductivity (often denoted k, λ, or κ) between the two interfaces of 1 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} \cdot K^{-1}$ between 0° C. and 100° C. include almost all metals and their alloys (e.g., copper, aluminum, gold, etc.), some plastics (e.g., TECACOMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is continuous piece of a material that has a thermal conductivity (often denoted k, λ, or κ) between the two interfaces of 100 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} \cdot K^{-1}$ or greater between 0° C. and 100° C. include certain types of copper, aluminum, silver, and gold.

Computer. As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Provide: As used herein, to "provide" an item means to have possession of and/or control over the item. This may include, for example, forming (or assembling) some or all of the item from its constituent materials and/or, obtaining possession of and/or control over an already-formed item.

A number. Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:
1. A cold plate, comprising:
a body formed from a thermally conductive material and including a first thermal interface surface that is to, when the cold plate is installed in a computing device and in operation, receive by conduction heat generated by a first component of the computing device;
a liquid coolant channel extending through the body between an inlet and an outlet; and
a plurality of orifices in the first thermal interface surface that fluidly connect into the liquid coolant channel.

2. The cold plate of claim 1, comprising:
one or more inserts comprising surface extensions, each of the inserts to be inserted in one of the plurality of orifices when the cold plate is installed in the computing device.

3. The cold plate of claim 1, comprising:
a heat transfer plate that is to, when the cold plate is installed: thermally couple to the first thermal interface surface, cover the plurality of orifices, and thermally couple to the first component.

4. The cold plate of claim 1,
wherein the thermally conductive material forming the body is a thermally conductive plastic.

5. The cold plate of claim 1,
wherein the body includes:
a memory cooling section that includes the first thermal interface surface, the memory cooling section to receive heat from memory modules of the computing device when in operation, the first component being one of the memory modules; and
a processor cooling section that is to cool a processor.

6. The cold plate of claim 5,
wherein the memory cooling section includes
a first subsection that includes a first subset of the plurality of orifices, and
a second subsection that includes a second subset of the plurality of orifices, and
the channel is routed through the body such that, when liquid coolant flows from the inlet to the outlet, the liquid coolant flows through the first subsection, then through the processor section, and then through the second subsection.

7. A method, comprising:
providing the cold plate of claim 1,
installing the cold plate in the computing device; and
thermally coupling the first component to the first thermal interface surface.

8. The method of claim 7, comprising:
inserting a number of inserts comprising surface extensions into a number of the orifices.

9. A computing device, comprising:
a printed circuit assembly (PCA) comprising a processor and a number of memory modules;
the cold plate of claim 1 installed on the PCA such that the body is thermally coupled to the processor and the first thermal interface surface is thermally coupled to the memory modules, the first component being one of the memory modules.

10. The computing device of claim 9, comprising:
one or more inserts comprising surface extensions, each of the inserts being inserted in one of the plurality of orifices.

11. The computing device of claim 10, comprising:
a thermal transfer plate that is: thermally coupled to the first thermal interface surface, covering the plurality of orifices, and thermally coupled to the memory modules.

12. The computing device of claim 10,
wherein the body includes a memory cooling section that includes the first thermal interface surface and that is thermally coupled to the memory modules, and a processor cooling section that is thermally coupled to the processor, and
a first subset of the plurality of orifices are disposed upstream of the processor section and a second subset of the plurality of orifices are disposed downstream of the processor section; and
more of the inserts are inserted in the second subset of orifices than are inserted in the first subset of orifices.

13. A computing device, comprising;
a printed circuit assembly (PCA) comprising a processor and a number of memory modules;
a cold plate, comprising:
a body formed from a thermally conductive plastic and including a processor section thermally coupled to the processor and a memory section that includes a first thermal interface surface that is thermally coupled to the memory modules;
a liquid coolant channel extending through the body between an inlet and an outlet;
a plurality of orifices in the first thermal interface surface that fluidly connect into the channel;
one or more inserts comprising surface extensions, each of the inserts being inserted in one of the plurality of orifices.

14. The computing device of claim 13, comprising:
a thermal transfer plate disposed on the thermal interface surface covering the plurality of orifices; and
heat transfer devices, each in contact with the thermal transfer plate and one or more of the memory modules.

15. The computing device of claim 13,
wherein a first subset of the plurality of orifices are disposed upstream of the processor section and a second subset of the plurality of orifices are disposed downstream of the processor section; and
more of the inserts are inserted in the second subset of orifices than are inserted in the first subset of orifices.

16. A computing device, comprising:
a printed circuit assembly (PCA) comprising a plurality of processors and a plurality of groups of memory modules, each of the groups of memory modules associated with one of the processors;
a plurality of cold plates, each corresponding to one of the processors and one of the groups of memory modules, each of the cold plates comprising:
a body formed from a thermally conductive plastic and including a processor section thermally coupled to the corresponding processor and a memory section that includes a first thermal interface surface that is thermally coupled to the corresponding group of memory modules;
a liquid coolant channel extending through the body between an inlet and an outlet;
a plurality of orifices in the first thermal interface surface that fluidly connect into the channel; and
one or more inserts comprising surface extensions, each of the inserts being inserted in one of the plurality of orifices;
a liquid coolant supply line connected to the respective inlets of the cold plates; and
a liquid coolant return line connected to the respective outlets of the cold plates.

17. The computing device of claim 16,
wherein the cold plates are connected in parallel between the liquid coolant supply line and the liquid coolant return line.

18. The computing device of claim 16,
wherein two of the cold plates are connected in series between the liquid coolant supply line and the liquid coolant return line.

19. The computing device of claim 18,
wherein, of the two cold plates that are connected in series, the cold plate that is downstream has more of the inserts installed than the cold plate that is upstream.

20. The computing device of claim 16,
wherein, for each of the cold plates:
- a first subset of the plurality of orifices are disposed upstream of the processor section and a second subset of the plurality of orifices are disposed downstream of the processor section; and
- more of the inserts are inserted in the second subset of orifices than are inserted in the first subset of orifices.

\* \* \* \* \*